United States Patent
Shikata et al.

[11] Patent Number: 5,943,220
[45] Date of Patent: Aug. 24, 1999

[54] WATERPROOFED POWER SUPPLY APPARATUS

[75] Inventors: Kunio Shikata, Minoo; Masao Katooka, Kawanishi; Toru Arai, Kyoto; Shigeru Okamoto, Hirakata; Kenzo Danjo, Soraku-gun, all of Japan

[73] Assignee: Sansha Electric Manufacturing Company, Limited, Osaka, Japan

[21] Appl. No.: 08/926,285

[22] Filed: Sep. 5, 1997

[30] Foreign Application Priority Data

Sep. 24, 1996 [JP] Japan .................................. 8-274154

[51] Int. Cl.⁶ ...................................................... H05K 9/00
[52] U.S. Cl. ........................ 361/818; 174/35 R; 307/150
[58] Field of Search ........................ 307/150; 174/35 R, 174/35 MS; 363/141, 144; 361/35, 38, 600, 601, 622, 623, 641, 836, 704–707, 717–719, 816, 818

[56] References Cited

U.S. PATENT DOCUMENTS 4,887,187 12/1989 Nickola ................................... 361/664
5,150,282 9/1992 Masashi ................................... 361/818
5,204,497 4/1993 Herrick .................................. 174/35 R
5,206,796 4/1993 Thompson .............................. 361/424
5,252,782 10/1993 Cantrell .................................. 361/818

FOREIGN PATENT DOCUMENTS

B-34521/95 5/1996 Australia .
8-140349 9/1996 Japan .

Primary Examiner—Gerald P. Tolin
Attorney, Agent, or Firm—William H. Murray

[57] ABSTRACT

A power supply apparatus includes a front panel, a rear panel and two left and right side panels which together form a housing. Opposed edges of a partition are connected to the front and rear panels to thereby divide the interior space of the housing into upper and lower chambers. The left and right side panels each have edges which are placed to abut against the corresponding edges of the other side panel.

Components of a power supply circuit are appropriately distributed in the upper and lower chambers. Some of the components in the upper chambers are located beneath the upper abutting edges of said left and right side panels, and a cover is disposed to cover at least those components which are located beneath the upper abutting edges.

8 Claims, 1 Drawing Sheet

WATERPROOFED POWER SUPPLY APPARATUS

This application is based on Japanese Patent Application No. HEI 8-274154 filed on Sep. 24, 1996 which is incorporated herein by reference.

BACKGROUND OF THE INVENTION

The present invention relates to a power supply apparatus for equipment, such as an arc welder, an arc cutter, a plasma arc welder, a plasma arc cutter, an electric charger and a noble metal plating apparatus.

Usually, this type of power supply apparatus converts commercial AC power into DC power by means of an AC-DC converter including, for example, a rectifier and a smoothing circuit. The DC power is then converted to high-frequency power by means of an inverter, and the high-frequency power from the inverter is voltage-transformed by a high-frequency transformer. The voltage-transformed high-frequency power is then converted back to DC power by a rectifier and a smoothing circuit, and the resulting DC power is applied to, for example, an arc welder.

The above-described arrangement requires no large voltage-transformer or choke coils, and, therefore, the power supply apparatus can be small in size and light in weight.

Japanese Unexamined Patent Publication No. HEI 8-140349 published on May 31, 1996 discloses a technique for further reducing the size and weight of power supply apparatuses of the above-described type. A power supply apparatus according to the disclosure in this Japanese unexamined patent publication includes a housing in which a power supply circuit is housed. The housing is formed by a front panel, a rear panel spaced from the front panel, and left and right side covers spaced from each other, which altogether define a space within the housing. The panels and covers are made of plastics for reducing the weight. Further, the left and right side covers are of the same shape so that the number of moldings required for fabricating the covers can be reduced. The abutment lines along which the top and bottom edges of the left and right side covers abut against each other for forming the housing together with the front and rear panels lie in the plain in which the vertical center lines extending through the front and rear panels lie.

A power supply apparatus with the above-described arrangement is often used outdoors, for example, an arc welder. In such a case, rain may enter into the interior of the housing through the abutment lines and drop on, for example, a printed circuit board on which a power supply circuit is arranged, to thereby cause failure of the power supply circuit.

Furthermore, because the housing is of plastics, the circuitry within the housing not only tends to be adversely affected by external radiation noise, but also tends to radiate noise. Such a power supply apparatus includes an inverter handling a high-frequency signal, as described above, and the inverter tends to radiate noise. When a plurality of arc welders powered from the above-described type of power supply apparatus are used simultaneously, noise radiated from the power supply apparatus of one arc welder may enter into the power supply apparatus of another arc welder to cause erroneous operation of the inverter of the latter power supply apparatus.

An objective of the present invention is to provide a power supply apparatus which is not only small in size and light in weight, but also provided with increased watertightness.

Another objective of the invention is to provide a power supply apparatus which is small in size and light in weight and tends to radiate little noise and tends to be little affected by noise from other equipment.

SUMMARY OF THE INVENTION

According to one aspect of the invention, a power supply apparatus includes a housing having an interior space therein. The housing is formed of two members each having an abutment surface. The two members are fastened together with the respective abutment surfaces abutting against each other so that the housing can be formed by the two members.

Power supply circuitry is disposed within the housing. At least part of the power supply circuitry is located near the abutment line along which the abutment surfaces of the two members abut against each other. The power supply apparatus further includes a cover which is placed over the power supply circuitry at least in the part located near the abutment line.

The entirety of the cover may include an electrically conductive material.

The surface of the electrically conductive material facing the abutment line may be coated with an anti-corrosive material.

A drainage hole may be formed to extend through the bottom of the housing.

According to a second aspect of the invention, a power supply apparatus includes a front panel and a rear panel spaced from the front panel. Two side panels are disposed on opposite sides of the zone defined between the front and rear panels to surround the zone to thereby define an interior space in the housing. The two side panels are fastened together. Each of the side panels has upper and lower abutment surfaces which abut against the upper and lower abutment surfaces of the other side panel. A partition disposed in the housing has its opposite edges joined respectively to the front and rear panels to thereby divide the interior space into upper and lower spaces. Power supply circuitry has its components disposed in the upper and lower spaces. Some of the components in the upper space are located beneath the upper abutment line along which the abutment surfaces of the side panels abut against each other. A cover is disposed in the upper space to cover at least those ones of the components in the upper space which are located beneath the upper abutment line.

The components disposed in the upper space may include a component handling a high-frequency signal, and the entirety of the cover may include an electrically conductive material.

A drainage hole may be formed in the bottom portion of the side panels.

The components within the lower space may be mounted on the partition.

DESCRIPTION OF A PREFERRED EMBODIMENT

Figure 1:
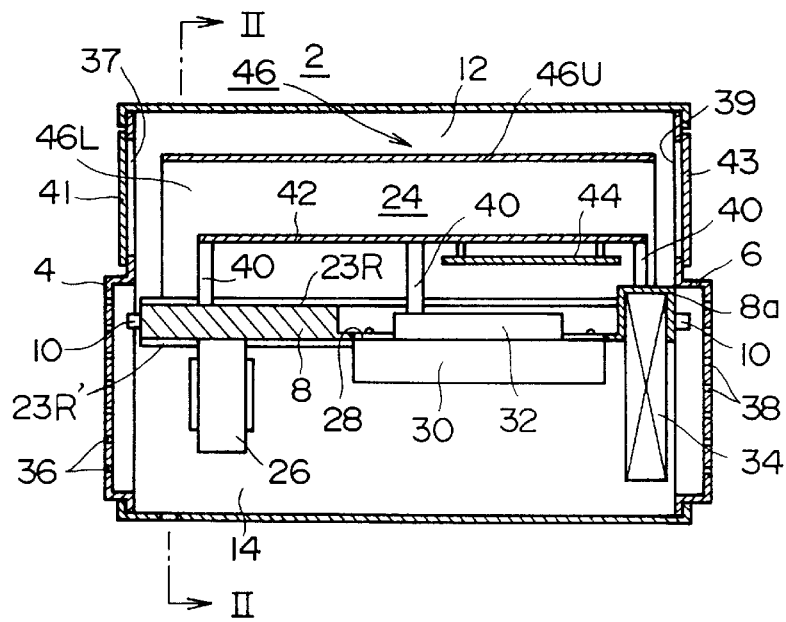
FIG. 1 shows a longitudinal cross-section of a power supply apparatus according to an embodiment of the present invention, along the line I—I in FIG. 2.
Figure 2:
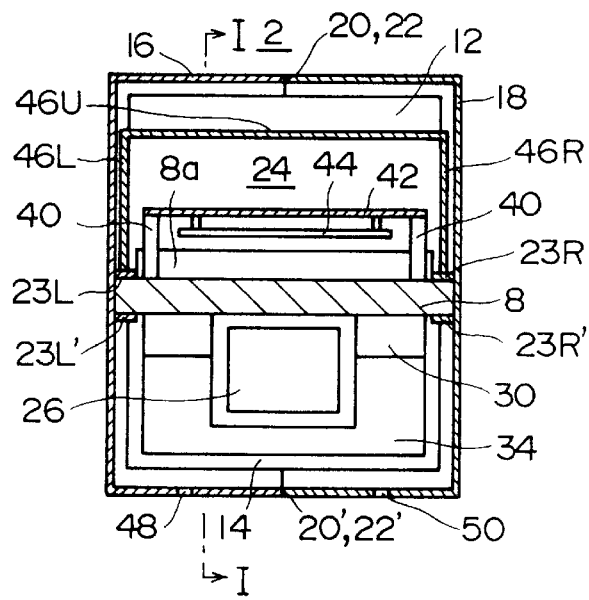
FIG. 2 is a cross-sectional view along the line II—II in FIG. 1.

A power supply apparatus according to one embodiment of the present invention includes a housing 2, as shown in FIGS. 1 and 2. The housing 2 includes a substantially rectangular front panel 4, and a substantially rectangular rear panel 6 spaced from the front panel 4. Partitioning means, e.g. an intermediate board 8, couples the front panel 4 and the rear panel 6. More specifically, the intermediate board 8 is substantially rectangular when viewed in plan, and has its opposite end portions connected, by means of two connecting members 10 formed at each end portion thereof, to the front and rear panels 4 and 6 at a level vertically intermediate between the top and bottom edges of the panels 4 and 6.

As shown in FIG. 2, left and right side walls, e.g. a left panel 16 and a right panel 18 are disposed on the left and right sides of a space defined between the front panel 4 and the rear panel 6 to enclose the space. The left and right panels 16 and 18 have the same shape, and each have a generally U-shaped cross-section. The panels 16 and 18 have end surfaces 20, 20' and 22, 22', respectively, which abut against each other in a vertical plane passing through the longitudinal center line of the intermediate board 8. The left and right panels 16 and 18 also have respective upper ridges 23L and 23R and lower edges 23L' and 23R', which extend along the length of the panels 16 and 18. The ridges 23L and 23L' sandwiches the left side edge of the intermediate board 8 between them, while the ridges 23R and 23R' sandwiches the right side edge, so that the intermediate board 8 is securely held. Thus, the intermediate board 8 divides the interior space of the housing into two chambers, namely, an upper chamber 12 and a lower chamber 14.

A power supply circuit 24 is disposed within the housing 2. The power supply circuit 24 may include a first converter circuit, a high-frequency inverter, a high-frequency transformer, and a second converter circuit. The first converter circuit rectifies and smooths an AC voltage. The output voltage of the first converter circuit is converted to a high-frequency voltage by the high-frequency inverter. The high-frequency voltage from the inverter is voltage transformed by the high-frequency transformer. The transformed version of the high-frequency voltage is then converted back into a DC voltage by the second converter circuit. The DC voltage from the second converter circuit is applied between a workpiece and a torch when the power supply apparatus is used with an arc welder, for example.

Of the circuit components of the power supply circuit 24, the high-frequency transformer 26, for example, is disposed in the lower chamber 14. The transformer 26 is mounted on the lower surface of the intermediate board 8 at a location relatively near to the front panel 4.

An opening 28 extends through the board 8. Heat dissipating means, e.g. a heat sink 30, is mounted on the lower surface of the intermediate board 8 to substantially close the opening 28.

On the upper surface facing to the upper chamber 12 of the heat sink 30, a semiconductor module 32 is mounted. The semiconductor module 32 includes a plurality of semiconductor switching devices, e.g. IGBTs (insulated gate bipolar transistors) or power FETs, which form the high-frequency inverter. The semiconductor module 32 may include other semiconductor devices, e.g. diodes which form the two converter circuits.

Heat developed by the semiconductor module 32 is released through the heat sink 30 into the lower chamber 14.

Components which develop a relatively large amount of heat are disposed in the lower chamber 14. Heat developed by the high-frequency transformer 26 is also released into the lower chamber 14. For expelling the heat from the housing 2, a fan 34 is disposed in the lower chamber 14. (It should be noted that in FIG. 1, though the fan 34 should be shown in cross-section, it is not actually. It is shown schematically in order to simplify the illustration.) The heat expelling fan 34 is mounted on the intermediate board 8 at a location closest to the rear panel 6. Also, air intake openings 36 and air discharge openings 38 are formed to extend through portions of the front panel 4 and the rear panel 6, respectively, facing the lower chamber 14. When the fan 34 is operated, air is taken into the lower chamber 14 through the openings 36 in the front panel 4 and heated air is expelled through the openings 38 in the rear panel 6.

As shown in FIG. 1, the intermediate board 8 includes a portion 8a which protrudes upward relative to the remaining portion to thereby form a downward facing recess into which part of the fan 34 is fitted and held securely. As shown in FIG. 2, the left and right side surfaces of the portion 8a are located more inward than the side surfaces of the remaining portion of the intermediate board 8 so that the presence of the portion 8a cannot be an obstacle to the support of the intermediate board 8 by the ridges 23L, 23L', 23R and 23R'.

The front and rear panels 4 and 6 are of the same size. The air intake and discharge openings 36 and 38 are formed in the respective panels at the same relative locations. Further, the front and rear panels 4 and 6 include respective windows 37 and 39 of the same size in the same relative locations in the upper portion of the panels. Thus, the front panel 4 and the rear panel 6 are of the same size and shape.

A control panel 41 is mounted outside the window 37 in the front panel 4 to close it. Although not shown, a printed circuit board on which a pilot lamp and various control switches are disposed is secured inside the window 37. The pilot lamp and manipulating rods or members of the switches extend out through the control panel 41.

An insulator board 43 is disposed outside the window 39 in the rear panel 6 to close it. Although not shown, devices including a power supply switch and a connector for introducing an AC supply voltage into the apparatus are mounted on the insulator board 43.

A printed circuit board 42 is disposed in the upper chamber 12. The printed circuit board 42 is mounted by means of six spacers 40 on the intermediate board 8. Although not shown, smoothing capacitors of the two converter circuits of the power supply circuit are disposed on the printed circuit board 42.

A control printed circuit board 44 is mounted on the lower surface of the printed circuit board 42 which includes a control circuit. The control circuit controls, for example, the semiconductor switching devices of the high-frequency inverter in such a manner that the output voltage of the inverter is kept constant.

A part of the printed circuit board 42 is located beneath the line along which the upper end surfaces 20 and 22 of the left and right panels 16 and 18 abut against each other.

A cover 46 is disposed in the upper chamber 12. As shown in FIG. 2, the cover 46 includes an upper wall 46U which is located above the printed circuit board 42 and has such a size as to be able to cover the entirety of the printed circuit board 42. The cover 46 includes also left and right side walls 46L and 46R which extend from the left and right side edges of the upper wall 46U to the upper surfaces of the upper ridges 23L and 23R, respectively. The cover 46 is fixed relative to the housing by any suitable means.

Figure 3:
FIG. 3 is an enlarged, cross-sectional view of part of a cover used in the power supply apparatus of FIG. 1.

A part of the cover 46 is shown, enlarged, in FIG. 3. The cover 46 is formed of an electrically conductive material, e.g. metal foil, and, more specifically, aluminum foil or copper foil 52. The surfaces of the conductive foil 52 are coated with layers 54 and 56 of a material having corrosion-resistant and/or heat-resistant property, e.g. heat-resistant polyvinyl chloride or heat-resistant polyester. In place of metal foil, electrically conductive carbon resin may be used. A composite comprising metal foil having both surfaces coated with any of the above-described corrosion-resistant and/or heat-resistant materials is relatively soft. Accordingly, the cover 46 including the upper wall 46U and the left and right walls 46L and 46R can be formed by relatively simple bending processing of a single plate of the composite.

It is preferable to electrically connect the conductive material of the cover 46 to a reference potential point on the printed circuit board 42 or the control printed circuit board 44.

The left and right panels 16 and 18 include in their bottom walls, round drainage holes 48 and 50, respectively, which extend through the bottom walls, for discharging water, if any, from the interior of the housing 2.

When the power supply apparatus arranged as described above is being used outdoors, rainwater may enter into the interior of the housing through gaps, if any, between the abutting upper end surfaces 20 and 22 of the left and right panels 16 and 18. Rainwater may drop on the upper wall 46U. It flows along the outer surfaces of the left and right side walls 46L and 46R down onto the upper ridges 23L and 23R, and, then, flows through minute gaps between the intermediate board 8, on one hand, and the upper ridges 23L and 23R, the inner walls of the left and right panels 16 and 18 between the upper and lower ridges 23L and 23L' and 23R and 23R', and the lower ridges 23L' and 23R', on the other, down into the lower chamber 14. The rainwater then flows out through the drainage holes 48 and 50.

With the above-described arrangement, the components in the upper chamber 12 are protected from getting wet and damaged with rainwater by the cover 46. The components disposed in the lower chamber 14 are shielded by the intermediate board 8 from rainwater which may drop on the board 8. In addition, the components in the lower chamber 14 are mounted on the board 8 and spaced from the bottom surfaces of the left and right panels 16 and 18. Accordingly, they never get wet with the rainwater which flows from the upper chamber 12 down into the lower chamber 14 and further into the drainage holes 48 and 50.

The cover 46 is formed of an electrically conductive material, so it can function as a shield case, too. Thus, any high-frequency signals radiated from neighboring equipment, such as other power supply apparatuses, are prevented from reaching the control printed circuit board 44 to cause erroneous operation of the high-frequency inverter. Also, any high-frequency signals radiated from the control printed circuit board 44 are prevented from reaching neighboring equipment by the cover 46.

Because the cover 46 includes the coatings of corrosion resistant material, it is not corroded by rainwater. Furthermore, since the coatings are also heat-resistant, the cover is never deformed by heat even if the components in the upper chamber 12 happen to develop heat.

The cover 46 of the above-described embodiment is formed of metallic foil, but, in place of the metallic foil, a sheet of resin dispersed with metal particles may be used.

Further, the cover 46 has been described to cover all of the components in the upper chamber 12, but it may be modified to cover only those components which are beneath the surfaces 20 and 22 of the left and right panels 16 and 18 which are abutting against each other.

The cover 46 in the above-described embodiment includes the upper wall 46U, the left side wall 46L and the right side wall 46R, only. However, the cover may be provided with additional side walls facing the front and rear panels 4 and 6. Also, the cover 46 may be shaped to have a rounded roof.

Also, in place of the U-shaped cover 46, a single plate of electrically conductive material may be used. The electrically conductive plate may be attached to the left and right panels 16 and 18 above the printed circuit board 42 by appropriate means, such as connecting members like the members 10.

Furthermore, instead of coating the two major surfaces of the cover 46 with a corrosion-resistant and/or heat-resistant material, e.g. heat-resistant vinyl chloride resin, only the outer surface of the cover 46 may be coated. When the single plate is used in place of the U-shaped cover 46, only the surface facing the abutment line along which the end surfaces of the left and right panels 16 and 18 abut against each other may be coated with a corrosion-resistant and heat-resistant material.

Furthermore, the drainage holes 48 and 50 may be rectangular. Furthermore, a number of drainage holes may be formed in the bottom portions of the panels 16 and 18, in place of the two holes 48 and 50.

What is claimed is:

1. A power supply apparatus comprising:

a housing having a space therein, said housing including two members each having at least upper and lower end surfaces abutting against the corresponding end surfaces of the other member, each of said upper end surfaces extending at an angle with respect to a horizontal plane;

a power supply circuit disposed within said housing and having at least a part thereof located near said abutting upper end surfaces; and a cover for said power supply circuit disposed within said housing, said cover having a generally horizontally extending portion covering at least said part of said power supply circuit which is located near said abutting upper end surfaces.

2. The power supply apparatus according to claim 1 wherein said cover in its entirety includes an electrically conductive material.

3. The power supply apparatus according to claim 2 wherein a surface of said cover facing said abutting surfaces is coated with a corrosion-resistant material.

4. The power supply apparatus according to claim 1 wherein a drainage hole is formed in the bottom of said housing.

5. A power supply apparatus comprising:

a front panel and a rear panel spaced from said front panel to thereby define a space therebetween;

side panels disposed to surround said space from opposite sides thereof to thereby form a housing together with said front and rear panels, each of said side panels having upper and lower end surfaces abutting against the corresponding end surfaces of the other side panel;

a partition having its opposed edges connected to said front and rear panels within said space to thereby divide said space into an upper space and a lower space;

a power supply circuit having its components disposed in said upper and lower spaces, a part of the components thereof disposed in said upper space being located beneath said upper abutting end surfaces of said side panels; and a cover disposed in said upper space to cover at least said part of said power supply circuit, said cover having a generally horizontally extending upper wall which is located beneath said upper abutting end surfaces of said side panels and having side walls extending from opposing sides of said upper wall toward said partition.

6. The power supply apparatus according to claim 5 wherein a part of the components in said upper space includes a component which processes a high-frequency signal, and said cover in its entirety includes an electrically conductive material.

7. The power supply apparatus according to claim 5 wherein a drainage hole is formed in the bottom of said housing.

8. The power supply apparatus according to claim 7 wherein the components of said power supply circuit disposed in said lower space care mounted on said partition.

* * * * *